United States Patent [19]

Toy

[11] Patent Number: 5,463,311

[45] Date of Patent: Oct. 31, 1995

[54] APPARATUS AND METHOD FOR MEASURING OPERATING VOLTAGE ELECTRICAL SIGNALS IN A HIGH VOLTAGE ENVIRONMENT

[75] Inventor: Steve Toy, Auburn, Calif.

[73] Assignee: NEC Electronics, Inc., Mountain View, Calif.

[21] Appl. No.: 171,781

[22] Filed: Dec. 21, 1993

[51] Int. Cl.[6] ................................................... G01R 31/02
[52] U.S. Cl. ........................ 324/96; 324/72; 324/72.5; 324/127
[58] Field of Search .......................... 324/96, 127, 72, 324/72.5

[56] References Cited

U.S. PATENT DOCUMENTS 4,801,937  1/1989  Fernandes ..................... 340/870.16
5,311,116  5/1994  Rogers ............................. 324/72.5

OTHER PUBLICATIONS

"Art of Electronics" Paul Horowitz et al. pp. 712–713, 1989.

*Primary Examiner*—Kenneth A. Wieder
*Assistant Examiner*—Mark Wardas
*Attorney, Agent, or Firm*—Skjerven, Morrill, MacPherson, Franklin & Friel; Ken John Koestner

[57] ABSTRACT

A test system 100 for performing electrical testing in a high voltage or inhospitable or inconvenient environment 150 electrically isolates a measurement detector 130 located within the environment from an externally located measurement result display and selector 110. Electrical isolation is accomplished using a non-conducting fiber optic link 120 for communicating the measurement results.

6 Claims, 3 Drawing Sheets

५,४६३,३११

APPARATUS AND METHOD FOR MEASURING OPERATING VOLTAGE ELECTRICAL SIGNALS IN A HIGH VOLTAGE ENVIRONMENT

BACKGROUND OF THE INVENTION

1. Field of the Invention

The invention relates to electrical test systems, and more particularly to systems for testing electrical circuits in a high voltage, inhospitable or otherwise inconvenient environment.

2. Description of the Related Art

Many electrical systems, such as ion implanters, linear accelerators, and electrical/magnetic/servo control systems, operate at extremely high voltage levels. These high voltage electrical systems incorporate many electrical and electronic circuits, components and systems, which execute at much lower operating voltage ranges, with these operating voltage ranges referenced to the high voltage level of the electrical systems.

These low voltage circuits, components and systems must occasionally be tested for calibration, diagnostic, maintenance and troubleshooting purposes. Unfortunately, safe testing of the circuits, components and systems in their high voltage environment requires great care, if such testing can be accomplished at all, and can involve additional expense or delay. In some cases, the high voltage environment is powered down to perform tests. The test results of such experiments are unreliable since performance in the actual operating conditions is not tested. In other cases, failing components and circuits are simply replaced without testing or trouble-shooting in the hope of solving an equipment problem. Unfortunately these components and circuits are often expensive and difficult to replace in a timely manner.

What is needed is a safe, inexpensive, accurate, reliable and flexible apparatus and method for performing electrical testing in a high voltage environment.

SUMMARY OF THE INVENTION

The present invention is a safe, reliable and flexible system or apparatus, and an associated method of operation, for performing electrical testing in an inhospitable environment, such as a high voltage environment or an oil bath. The system or apparatus includes an electrical signal detector that electrically connects to a target circuit within the inhospitable environment and a display, external to the inhospitable environment, for displaying the measured electrical signals. The detector communicates measurement data to the display using an electrically nonconducting link, such as a fiber optic link.

In one embodiment the test system includes a measurement selector, external to the inhospitable environment, for requesting performance of a measurement by the electrical signal detector and an electrically nonconducting link for communicating this request to the detector.

The apparatus and method of the present invention advantageously provides for safe, reliable and flexible testing of electrical circuits in a high voltage or inhospitable environment. It does this by employing a nonconducting link for isolating a tester within the high voltage or inhospitable environment under test from a test requestor and a test measurement display.

High voltage systems, such as ion implanters, are frequently used to quickly produce great quantities of electronic components. Electrical circuits and systems within these high voltage systems occasionally fail, causing interruption of the manufacturing process. Such interruptions can be enormously expensive and an apparatus and method for reliably restoring operations is critical.

Since various components of the high voltage systems can fail, it is advantageous that the present invention is flexible, capable of servicing myriad system components, as it provides for electrical measurements performed between any test points.

BRIEF DESCRIPTION OF THE DRAWINGS

The present invention may be better understood and its advantages, objects and features made better apparent by making reference to the following description, taken in conjunction with the accompanying drawings, wherein.

DETAILED DESCRIPTION OF THE PREFERRED EMBODIMENT

Figure 1:
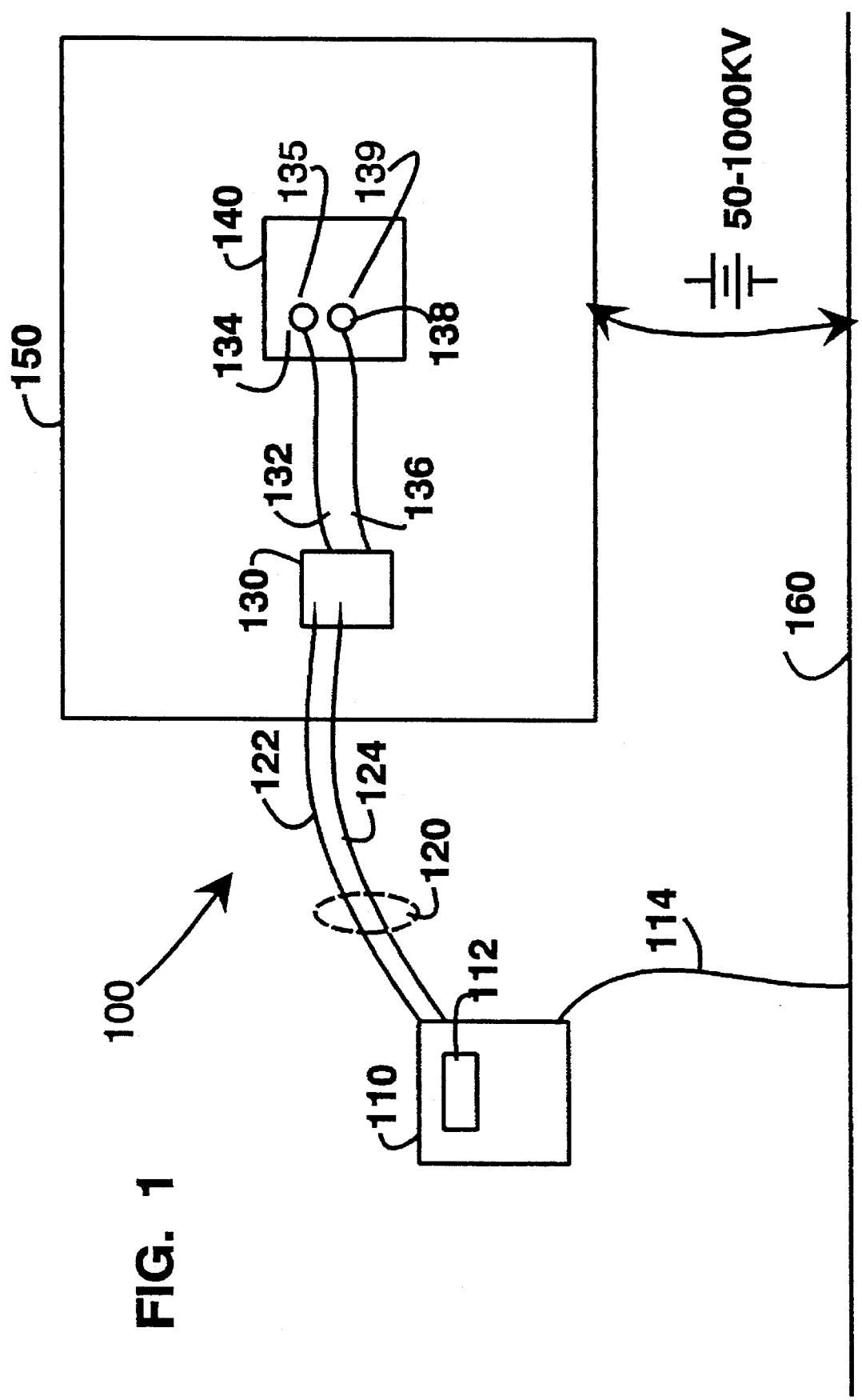
FIG. 1 is a pictorial representation of an apparatus for measuring electrical signals in a high voltage environment.

A test system 100 for measuring electrical signals is shown in FIG. 1 in which a display module 110 with a 4-digit display 112 and a cable 114 to ground potential 160 connects to a first fiber 122 and a second fiber 124 of a fiber-optic cable 120 to interface to a measurement module 130. To perform a measurement, the display module 110 is placed external to a high voltage environment 150 and the measurement module 130 is placed internal to the high voltage environment 150 where it is electrically connected to test points 135 and 139 on a system component 140. A cable 131 and connector 134 electrically connect the measurement module 130 to the test point 135 and a test cable 136 and test connector 138 electrically connect the measurement module 130 to the test point 139.

The hand-held display module 110 communicates with the measurement module 130 via fiber-optic cable 120 fibers 122 and 124 both to control measurements of the measurement module 130 and to receive measurement results. Fiber optic cables do not conduct electricity. Instead, fiber optic communication systems use fine glass or plastic fibers to transfer data in the form of pulses of light. Advantageously, the usage of fiber optic communication isolates the voltages local to the display module 110 from the high voltage environment 150 in which the measurement module 130 is placed. Furthermore, fiber optic communication is immune to electrical noise. It is therefore useful to employ fiber optic cables to transmit data from a sensor in an electrically noisy environment such as may be present in the high voltage test environment 150. The test system 100 is applied to measure electrical signals between the two test points 135 and 139 of the component 140 within the high voltage environment 150. While only two such test points are shown, it will be appreciated that many such test points may be connected to the measurement module 130, which is provided with suitable switches for selecting among the test points, as desired. The test points can be any accessible points in a circuit including conductive lines and circuit nodes. The test system 100 performs electrical measurements of the component 140, which may be any component present in a high voltage system, including integrated circuits, printed circuit boards and electrical systems which function at operating voltage levels relative to the high voltage environment 150 that exists in ion implanters, linear accelerators and high voltage control systems. Control systems that require a reference voltage at a high level, include precision analog control, magnetic control, and servo control systems. Measured electrical signals include AC voltage, DC voltage, impedance, resistance, current, power, frequency, signal gain and signal phase.

Although the test system 100 measures electrical signals from a system component 140 in a high voltage environment, for example in a voltage range including voltages from approximately 1 KV to approximately 10,000 KV relative to ground potential 160, the component 140 functions in its operating voltage range relative to the high voltage environment 150. The operating voltage range for the system component 140 typically ranges from approximately 0.01 volts to approximately 100 volts.

Figure 2:
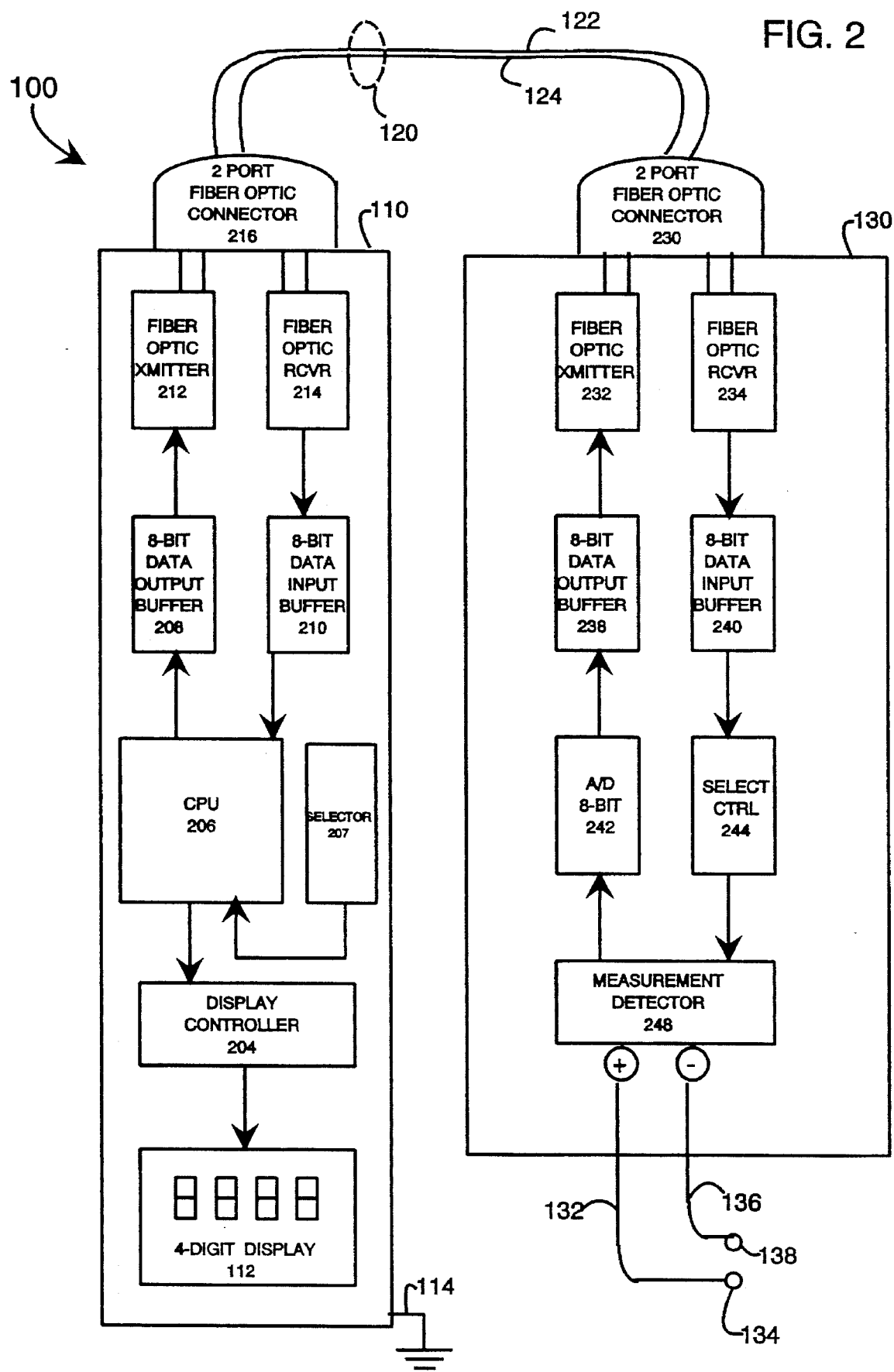
FIG. 2 is a is a schematic block diagram of the test apparatus shown in FIG. 1.

A schematic block diagram of the elements of the test system 100 are depicted in FIG. 2. The display module 110 may be any suitable user interface, including personal computers, laptops or personal communicators. The display module 110 includes a CPU 206 that receives inputs from an operator by means of a selector 207, which is a switch for signalling the CPU 206 that performance of a measurement is requested. The selector 207 couples to an interrupt line of the CPU 206. The selector 207 is chosen from a variety of computer input devices such as switches and buttons and may also be a keyboard switch. The CPU 206 drives any suitable display, such as a 4-digit display 112 by signals applied to a display controller 204. One example of a 4-digit display is a light-emitting diode (LED) array for displaying measured AC voltage, DC voltage, ohms and amperes. The display controller 204 configures signals from the CPU 206 into a form suitable for driving the display 112. For example, parallel output ports of the CPU 206 are configured for selecting the segments to be displayed and presenting data for driving the segments for driving the bank of four 7-segment displays of the 4-digit display 112.

The CPU 206 has input/output connections to the fiber-optic cable 120 fibers 111 and 124 by means of output signals to a data output buffer 108, which drives a fiber optic transmitter 112, and input signals to a data input buffer 210 that receives signals from a fiber optic receiver 214. The fiber optic transmitter 212 and fiber optic receiver 214 are connected to the fiber-optic cable 120 fibers 122 and 124 using a two port fiber optic connector 216.

The CPU 206 performs programmed operations such as responding to interrupt requests activated by the selector 207. The CPU 206 also transmits a code identifying the measurement or measurements to be performed to the remote device via signals written to the 8-bit data output buffer 208. The CPU 206 receives measurement result data from the remote device 130 via the 8-bit data input buffer 210 and formats the received result data for display and writing the formatted data to the 4-digit display 112 via the display controller 204.

The 8-bit data output buffer 208 accepts eight parallel data bits from the CPU 206, along with parallel control bits. The output buffer 208 latches the data bits in an internal parallel register (not shown), then transfers the data bits to a transmitter shift register (not shown) and shifts the bits one by one to the fiber optic transmitter 212. In this manner the buffer 208 performs asynchronous communication of data in the form of characters to communicate to the remote device codes that identify measurements to be made. Parallel data that identifies a measurement is conveyed by the CPU 206 to the data output buffer 208.

The data input buffer 210 shifts bits from the fiber optic receiver 214 in to a shift register (not shown) internal to the data input buffer 210.

Operations of both the data input 208 and output 210 buffers may alternatively be performed by a universal asynchronous receiver/transmitter (UART), and transfers the data bits to a latch (not shown), which furnishes the data bits of a parallel output.

The fiber-optic cable 120 fibers 122 and 124 are plastic or glass fibers having a diameter in the range from 2 to 1000 um. Large-diameter plastic fibers are generally used for short-distance, low-speed transmission applications such as the present test system 100. The optical fiber core surrounded by a cladding material and an outer sheath to protect the cladding and prevent external light from entering. The cladding material is nonconductive.

The display module 110 is connected to ground by the ground cable 114.

The measurement module 130 interfaces to the fiber-optic cable 120 fibers 122 and 124 by a two port fiber optic connector 230 which has connections to a fiber optic transmitter 232 and fiber optic receiver 234 transmitter 232 and receiver 234 are coupled to an 8-bit data output buffer 238 and 8-bit data input buffer 240, respectively, within the measurement module 130. The data output buffer 238 and data input buffer 240 are functionally equivalent to the buffers 208 and 210, respectively.

Fiber optic receivers 214 and 234 convert light signals into electrical signals using a photodetector (not shown) such as photodiodes. The receiver 234 may use a Schmitt trigger to form output pulses into a square wave.

A measurement detector 248 drives the 8-bit data output buffer 238 through an 8-bit A/D converter 242 and receives control signals through connections to the 8-bit data input buffer 240 via a selector control 244. The measurement detector 248 is a suitable measurement device, selected from devices such as digital multimeters, voltmeters, ammeters, impedance meters, network analyzers and signal analyzers.

Referring to FIGS. 1 and 2, an operator uses the test system 100 to test a system component 140 within the high voltage environment 150 by terminating power to the high voltage environment 150, positioning the measurement module 130 within the high voltage environment 150 in a suitable proximity to the system component 140 and attaching the connector 134 to the first test point 135 and the test connector 138 to the second test point 139. The operator positions the display module 110, which is connected by fiber optic cables to the measurement module 130, in a safe location external to the high voltage environment 150 and grounds the display module 110 using ground cable 114. The operator then directs the fiber optic cable through any suitable pass-through in the high voltage system and closes and secures all panels and doors of the high voltage system, carefully adhering to the manufacturers safety requirements and all other applicable safety requirements. One example of a suitable pass-through is a high voltage system door with a flexible seal. The cable is firmly compressed against the seal as the door is closed, isolating the high voltages within the system. Once the connections are confirmed to be proper and safe, the operator applies power to the high voltage environment and selects a measurement by initiating a measurement request using the selector 207 which activates the CPU 206 to control the measurement procedure. The CPU 206 formulates a measurement request code and writes it to the data output buffer 208. The measurement request code is sent to the measurement module 130 as the data output buffer 208 applies the code to the fiber optic transmitter 212 which sends the request over the fiber-optic cable 120 fiber 122 to the measurement module 130. The fiber optic receiver 234 acquires the measurement code and activates the selector control 244 via the data input buffer 240. The selector control 244 converts the measurement request code to a signal form suitable for driving the measurement detector 248. The measurement detector 248 executes the requested measurement and generates an analog result, which is applied to the analog to digital converter 242 for conversion to digital form. The digital signal is communicated to the CPU 206 within the display module 110 via the measurement module 130 data output buffer 238 and fiber optic transmitter 232, the fiber-optic cable 120 fiber 124 and the display module 110 fiber optic receiver 214 and data input buffer 210. The CPU 206 receives and formats the result data, and writes the formatted data to the 4-digit display 112 by way of the display controller 204.

Figure 3:
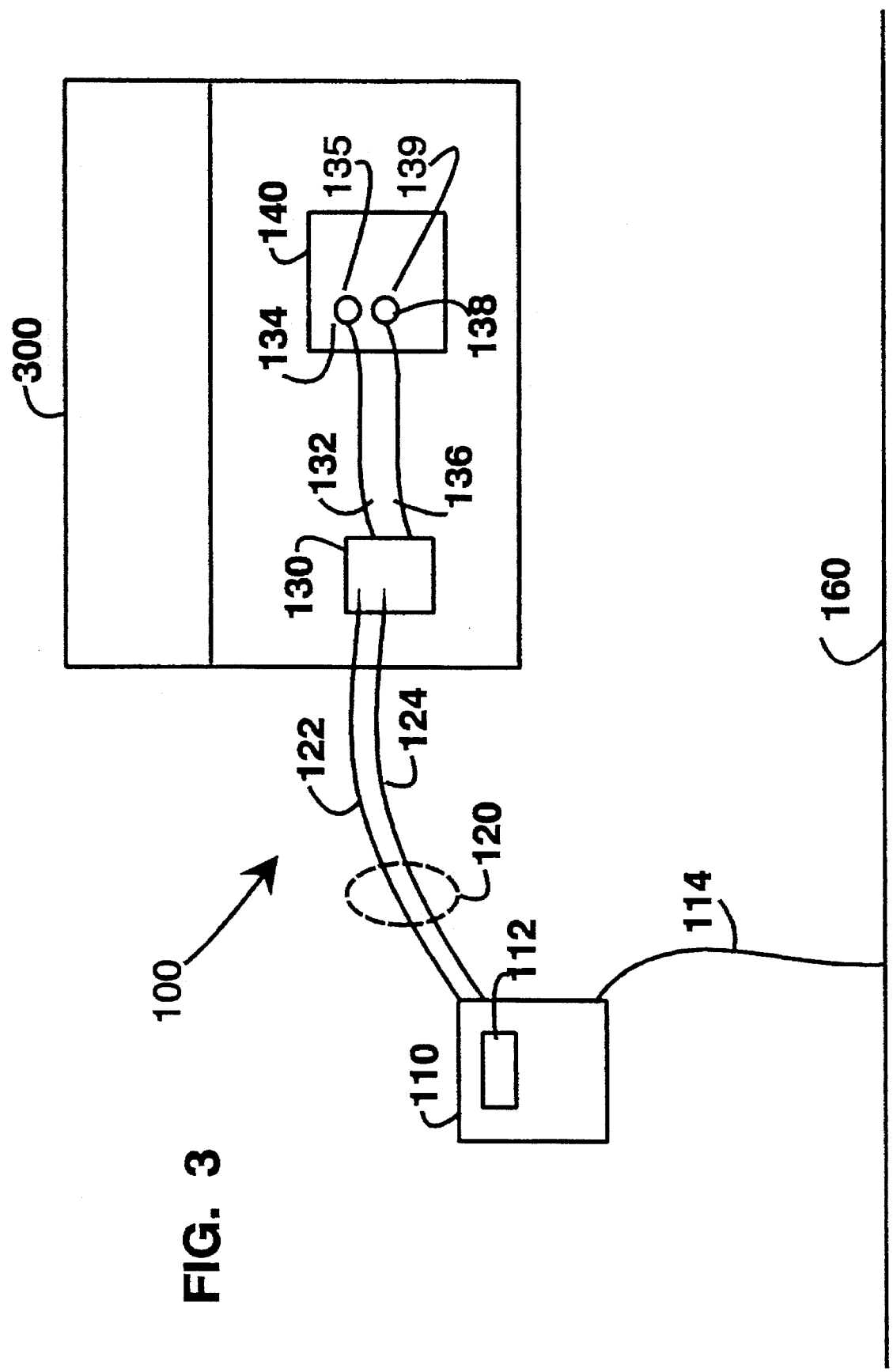
FIG. 3 is a pictorial representation of an apparatus for measuring electrical signals in an oil bath.

FIG. 3 depicts an alternative usage of the test system 100 in which electrical signals are measured from a system component 140, which is installed within an oil bath 300.

While the invention is described with reference to various embodiments, it is understood that these embodiments are illustrative and that the scope of the invention is not so limited. Many variations, modifications, additions and improvements of the described embodiments are possible that fall within the scope of the invention, as defined in the appended claims.

I claim:

1. An apparatus for measuring electrical signals from an electrical circuit in a high voltage environment, the electrical circuit functioning generally in a reduced operating voltage range referenced to a high reference voltage of the high voltage environment, the apparatus comprising:

a measurement module configured to be portably positioned in the high voltage environment and referenced to the high reference voltage, the module including:

a measurement detector having test input terminals for attachable and detachable connection to various test points of the electrical circuit and an output terminal for furnishing a measured parameter; and a fiber-optic transmitter having an input terminal coupled to the output terminal of the measurement detector for receiving the measured parameter and an output terminal for transmitting the measured parameter;

an electrically-nonconductive fiber optic cable coupled to the output terminal of the transmitter; and a display module positioned external to the high voltage environment and coupled to the fiber optic cable including a receiver for receiving the measured parameter and a display for exhibiting a representation of the measured parameter;

wherein the high voltage environment has a voltage range including voltages from approximately 1 KV to approximately 10,000 KV.

2. An apparatus as in claim 1, wherein:

the display module further includes a selector for choosing an electrical signal to be measured and a transmitter for sending an identifier of the signal to be measured;

the communication link further includes a line coupled to the display module transmitter for carrying the signal identifier; and the measurement module further includes a receiver connected to the communication link identifier line for accepting the signal identifier and a selection controller for receiving the signal identifier from the receiver and activating the measurement detector to perform the identified signal measurement.

3. An apparatus as in claim 2, wherein the electrical signals measured from the electrical circuit are selected from a group consisting of AC voltage, DC voltage, impedance, resistance, current, power, frequency, signal gain and signal phase.

4. An apparatus as in claim 3, wherein the operating voltage range of the electrical circuit includes voltages from approximately 0.01 volts to approximately 100 volts.

5. An apparatus as in claim 1, wherein the electrical circuit is selected from the group consisting of integrated circuits, printed circuit boards and electrical systems.

6. An apparatus as in claim 1, wherein the measurement detector is selected from the group consisting of digital multimeters, voltmeters, ammeters, impedance meters, network analyzers and signal analyzers.

* * * * *